(12) United States Patent
Heo et al.

(10) Patent No.: US 12,707,791 B2
(45) Date of Patent: Aug. 11, 2026

(54) DISPLAY DEVICE USING SEMICONDUCTOR LIGHT-EMITTING DEVICES

(71) Applicant: LG ELECTRONICS INC., Seoul (KR)

(72) Inventors: Mihee Heo, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 841 days.

(21) Appl. No.: 17/798,780

(22) PCT Filed: Feb. 19, 2020

(86) PCT No.: PCT/KR2020/002377

§ 371 (c)(1),
(2) Date: Aug. 10, 2022

(87) PCT Pub. No.: WO2021/162159

PCT Pub. Date: Aug. 19, 2021

(65) Prior Publication Data

US 2023/0107331 A1 Apr. 6, 2023

(30) Foreign Application Priority Data

Feb. 13, 2020 (KR) ........................ 10-2020-0017883

(51) Int. Cl.
*H10H 29/14* (2025.01)

(52) U.S. Cl.
CPC ................................. *H10H 29/142* (2025.01)

(58) Field of Classification Search
CPC ......... H01L 25/167; H01L 2924/12041; H01L 2924/12044; H10H 20/032; H10H 29/142;

(Continued)

(56) References Cited

U.S. PATENT DOCUMENTS

2020/0258962 A1* 8/2020 Ohchi .................. H10K 59/122
2021/0343784 A1* 11/2021 Kwag ................. H01L 25/0753

FOREIGN PATENT DOCUMENTS

JP 2014-120550 6/2014
JP 2019-079979 5/2019

(Continued)

OTHER PUBLICATIONS

Korean Intellectual Property Office Application No. 10-2020-0017883, Office Action dated Sep. 6, 2024, 6 pages.

(Continued)

*Primary Examiner* — Julia Slutsker
(74) *Attorney, Agent, or Firm* — LEE, HONG, DEGERMAN, KANG & WAIMEY

(57) ABSTRACT

A display device, according to the present invention, comprises: semiconductor light-emitting devices; and a substrate on which the semiconductor light-emitting devices are received, and which comprises wiring electrodes electrically connected to the semiconductor light-emitting devices. The substrate comprises: a base part; assembly electrodes disposed on the base part so as to extend in one direction; a dielectric layer formed so as to cover the assembly electrodes; and a partition part formed on the dielectric layer and forming cells in which the semiconductor light-emitting devices are seated, wherein the partition part comprises a first partition part formed from metal material, and a second partition part formed from insulating material, and the first partition part and second partition part comprise a micropattern.

8 Claims, 13 Drawing Sheets

(58) Field of Classification Search
CPC ........ H10H 29/30; H10H 20/01; H10H 20/81; H10H 20/83; H10W 90/00; H10W 72/01936
See application file for complete search history.

(56) References Cited

FOREIGN PATENT DOCUMENTS

| | | |
|---|---|---|
| KR | 10-1000311 | 12/2010 |
| KR | 10-2019-0077254 | 7/2019 |
| KR | 10-2019-0113695 | 10/2019 |
| KR | 1020190122118 | 10/2019 |

OTHER PUBLICATIONS

PCT International Application No. PCT/KR2020/002377, International Search Report dated Nov. 6, 2020, 5 pages.

* cited by examiner

DISPLAY DEVICE USING SEMICONDUCTOR LIGHT-EMITTING DEVICES

CROSS-REFERENCE TO RELATED APPLICATIONS

This application is the National Stage filing under 35 U.S.C. 371 of International Application No. PCT/KR2020/002377, filed on Feb. 19, 2020, which claims the benefit of earlier filing date and right of priority to Korean Application No. 10-2020-0017883, filed on Feb. 13, 2020, the contents of which are all incorporated by reference herein in their entirety.

TECHNICAL FIELD

The present disclosure relates to a display device using a semiconductor light-emitting device, and more particularly, to a display device using a semiconductor light-emitting device having a size of several to tens of μm.

BACKGROUND ART

In recent years, liquid crystal displays (LCDs), organic light-emitting diode (OLED) displays, and micro-LED displays have been competed to implement a large-area display in the field of display technology.

Among them, a display using a semiconductor light-emitting device (micro-LED) having a diameter or cross-sectional area of 100 μm or less may provide very high efficiency because it does not absorb light using a polarizing plate or the like.

However, since millions of semiconductor light-emitting devices are required to implement a large area in the case of a micro-LED display, it has difficulty in transferring the devices compared to other technologies.

Technologies currently in development for transfer processes of micro-LEDs include pick & place, laser lift-off (LLO), self-assembly, or the like. Among them, the self-assembly method, which is a method in which the semiconductor light-emitting device locates themselves in a fluid, is the most advantageous method for realizing a large-sized display device.

Meanwhile, the self-assembly method may include a method of directly transferring semiconductor light-emitting devices to a substrate to be used as a product, and a method of transferring semiconductor light-emitting devices to a substrate for assembly and then transferring them to a substrate to be used as a product. The former undergoes a transfer process once, so it is efficient in terms of the process, and the latter has an advantage capable of adding a structure for self-assembly to a substrate for assembly with no limitation, and those two methods are selectively used.

DISCLOSURE OF INVENTION

Technical Problem

An aspect of the present disclosure is to implement a display device having a structure capable of transferring semiconductor light-emitting devices at a high speed.

Solution to Problem

A display device according to the present disclosure may include semiconductor light-emitting devices and a substrate in which the semiconductor light-emitting devices are accommodated, the substrate including a wiring electrode electrically connected to the semiconductor light-emitting devices, wherein the substrate includes a base portion; assembly electrodes disposed on the base portion to extend in one direction; a dielectric layer formed to cover the assembly electrodes; and a partition wall portion formed on the dielectric layer while forming a cell on which the semiconductor light-emitting devices are placed, the partition wall portion includes a first partition wall portion formed on the dielectric layer and a second partition wall portion formed to cover the first partition wall portion, and the first partition wall portion and the second partition wall portion include a fine pattern.

According to the present disclosure, the second partition wall portion may be formed to cover the first partition wall portion along the fine pattern of the first partition wall portion.

According to the present disclosure, the fine pattern may be formed at an interface between the first partition wall portion and the second partition wall portion.

According to the present disclosure, the display device may further include a planarization layer formed on the second partition wall portion while filling into the cell.

According to the present disclosure, the fine pattern may be formed at an interface between the second partition wall portion and the planarization layer.

According to the present disclosure, the first partition wall portion may be formed of a metal material, and the second partition wall portion may be formed of an insulating material.

According to the present disclosure, the partition wall portion may be formed to overlap the assembly electrodes.

According to the present disclosure, the second partition wall portion may form an inner surface of the cell.

According to the present disclosure, the base portion may include a fine pattern on one surface on which the assembly electrodes are disposed.

According to the present disclosure, the assembly electrodes may be disposed on the base portion along the fine pattern of the base portion, wherein the dielectric layer is formed to cover the assembly electrodes along the fine pattern of the base portion.

According to the present disclosure, the semiconductor light-emitting devices may include a fine pattern having a shape corresponding to a fine pattern of the dielectric layer on a surface in contact with the dielectric layer.

Advantageous Effects of Invention

A display device according to the present disclosure may form fine patterns on partition wall portions, thereby improving a phenomenon in which semiconductor light-emitting devices are adsorbed to a surface of a substrate while moving during self-assembly, and transferring the semiconductor light-emitting devices at a high speed.

Furthermore, a first partition wall formed of a metal material may shield an electric field from leaking, thereby preventing the semiconductor light-emitting devices from being erroneously assembled in regions other than cells.

In addition, when a fine pattern is formed on a base portion, light generated from a semiconductor light-emitting device and emitted to a rear surface thereof may be reflected to a front surface thereof, thereby improving a light-emitting efficiency.

Moreover, when a fine pattern is formed on a base portion, the fine pattern corresponding to the base portion may be formed on one surface of a semiconductor light-emitting device in contact with the base portion, thereby maximizing a contact area between the semiconductor light-emitting device and the base portion.

MODE FOR THE INVENTION

Figure 1:
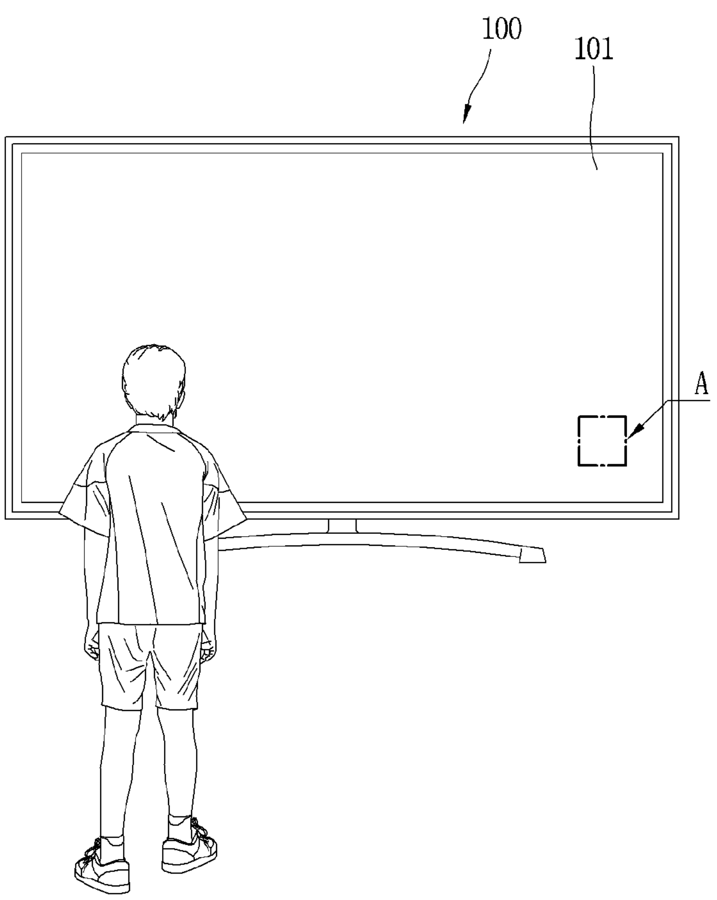
FIG. 1 is a conceptual view showing a display device using a semiconductor light-emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the embodiments disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a mobile phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, even if a new product type to be developed later includes a display, a configuration according to an embodiment disclosed herein may be applicable thereto.

Figure 2:
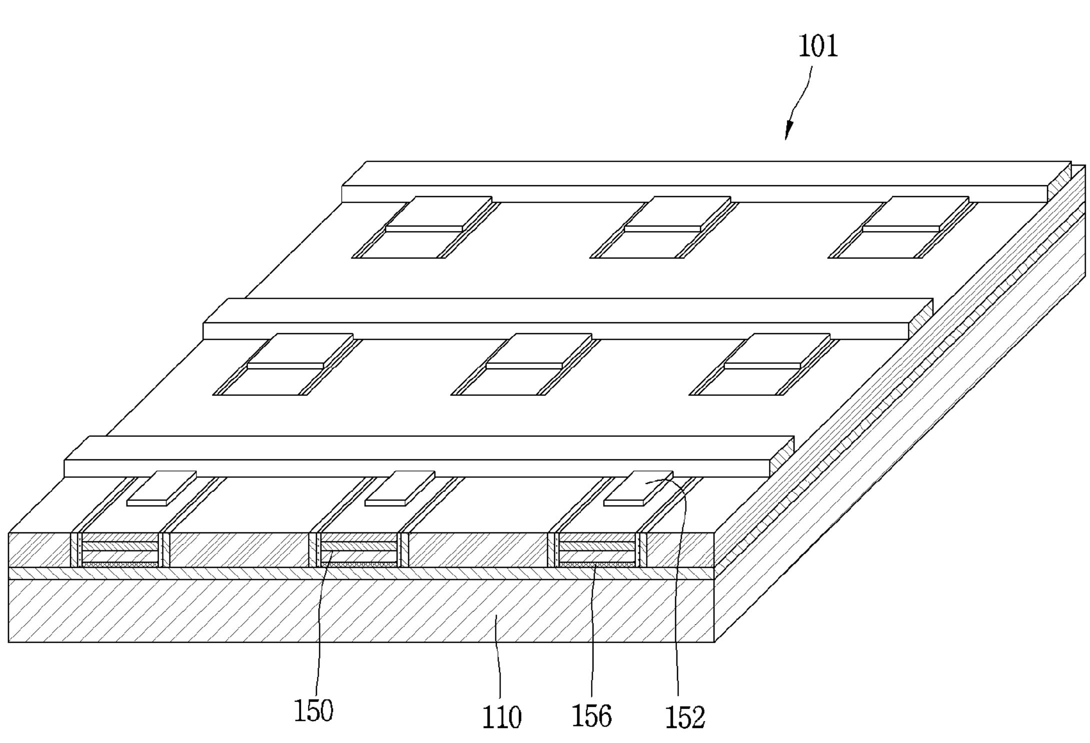
FIG. 2 is a partially enlarged view showing a portion "A" of the display device in FIG. 1.
Figure 3:
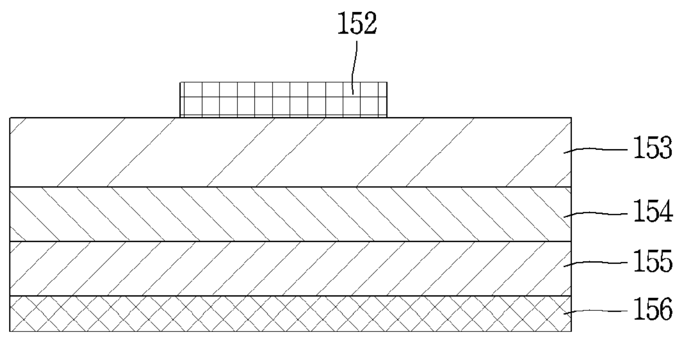
FIG. 3 is an enlarged view showing a semiconductor light-emitting device in FIG. 2.
Figure 4:
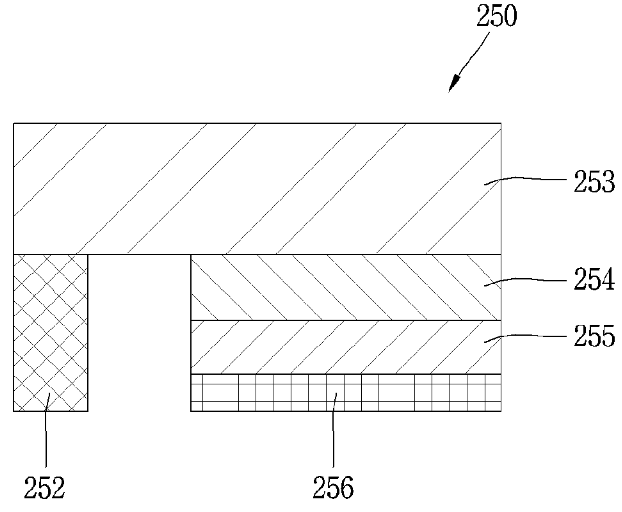
FIG. 4 is an enlarged view showing another embodiment of the semiconductor light-emitting device in FIG. 2.

FIG. 1 is a conceptual view showing a display device using a semiconductor light-emitting device according to an embodiment of the present disclosure, and FIG. 2 is a partially enlarged view showing a portion "A" of the display device in FIG. 1, and FIG. 3 is an enlarged view showing a semiconductor light-emitting device in FIG. 2, and FIG. 4 is an enlarged view showing another embodiment of the semiconductor light-emitting device in FIG. 2.

According to the illustration, information processed in the controller of the display device 100 may be displayed on a display module 140. A case 101 in the form of a closed loop surrounding an edge of the display module 140 may form a bezel of the display device 100.

The display module 140 may include a panel 141 on which an image is displayed, and the panel 141 may include micro-sized semiconductor light-emitting devices 150 and a wiring substrate 110 on which the semiconductor light-emitting devices 150 are mounted.

Wiring lines may be formed on the wiring substrate 110, and connected to an n-type electrode 152 and a p-type electrode 156 of the semiconductor light-emitting device 150. Through this, the semiconductor light-emitting device 150 may be provided on the wiring substrate 110 as a self-emitting individual pixel.

An image displayed on the panel 141 is visual information, and implemented by independently controlling the light emission of a sub-pixel arranged in a matrix form through the wiring lines.

According to the present disclosure, a micro-LED (Light Emitting Diode) is illustrated as one type of the semiconductor light-emitting device 150 that converts current into light. The micro-LED may be a light-emitting diode formed with a small size of 100 μm or less. The semiconductor light-emitting device 150 may be provided in blue, red, and green light-emitting regions, respectively, to implement a sub-pixel by a combination of the light-emitting regions. In other words, the sub-pixel denotes a minimum unit for implementing a single color, and at least three micro-LEDs may be provided in the sub-pixel.

More specifically, referring to FIG. 3, the semiconductor light-emitting device 150 may be a vertical structure.

For example, the semiconductor light-emitting device 150 may be implemented with a high-power light-emitting device that emits various lights including blue in which gallium nitride (GaN) is mostly used, and indium (In) and or aluminum (Al) are added thereto.

The vertical semiconductor light-emitting device 150 may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom may be electrically connected to a p-electrode of the wiring substrate 110, and the n-type electrode 152 located at the top may be electrically connected to an n-electrode at an upper side of the semiconductor light-emitting device 150. The electrodes may be disposed in the upward/downward direction in the vertical semiconductor light-emitting device 150, thereby providing a great advantage capable of reducing the chip size.

For another example, referring to FIG. 4, the semiconductor light-emitting device may be a flip chip type semiconductor light-emitting device.

For such an example, the semiconductor light-emitting device 250 may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 may be electrically connected to the p-electrode and the n-electrode of the wiring substrate 110 at the bottom of the semiconductor light-emitting device 250.

The vertical semiconductor light-emitting device 150 and the horizontal semiconductor light-emitting device 250 may be a green semiconductor light-emitting device, a blue semiconductor light-emitting device, and a red semiconductor light-emitting device, respectively. The green semiconductor light-emitting device and the blue semiconductor light-emitting device may be mostly formed of gallium nitride (GaN), and indium (In) and/or aluminum (Al) may be added thereto to implement a high-power light-emitting device that emits green or blue light. For such an example, the semiconductor light-emitting device may be a gallium nitride thin-film formed in various layers such as n-GaN, p-GaN, AlGaN, and InGa, and specifically, the p-type semiconductor layer may be p-type GaN, and the n-type semiconductor layer may be n-type GaN. However, in case of the red semiconductor light-emitting device, the p-type semiconductor layer may be p-type GaAs and the n-type semiconductor layer may be n-type GaAs.

Furthermore, the p-type semiconductor layer may be p-type GaN doped with Mg on a p-electrode side, and the n-type semiconductor layer may be n-type GaN doped with Si on an n-electrode side. In this case, the above-described semiconductor light-emitting devices may be semiconductor light-emitting devices without an active layer.

On the other hand, referring to FIGS. 1 through 4, since the light-emitting diode is very small, the display panel may be arranged with self-emitting sub-pixels arranged at fine pitch, thereby implementing a high-quality display device.

In a display device using the semiconductor light-emitting device of the present disclosure described above, a semiconductor light-emitting device grown on a wafer and formed through mesa and isolation is used as an individual pixel.

In this case, the micro-sized semiconductor light-emitting device 150 must be transferred to a wafer at a predetermined position on the substrate of the display panel. Pick & place is used for the transfer technology, but the success rate is low and a lot of time is required. For another example, there is a technology of transferring a plurality of devices at one time using a stamp or a roll, but the yield is limited and not suitable for a large screen display.

The present disclosure proposes a new fabrication method of a display device capable of solving the foregoing problems and a fabrication device using the same.

For this purpose, first, a new fabrication method of the display device will be described. FIGS. 5A to 5E are conceptual views for explaining a new process of manufacturing the foregoing semiconductor light-emitting device.

In this specification, a display device using a passive matrix (PM) semiconductor light-emitting device is illustrated. However, an example described below may also be applicable to an active matrix (AM) type semiconductor light-emitting device. In addition, a method of self-assembling a horizontal semiconductor light-emitting device is illustrated below, but it is also applicable to a method of self-assembling a vertical semiconductor light-emitting device.

Figure 5A:
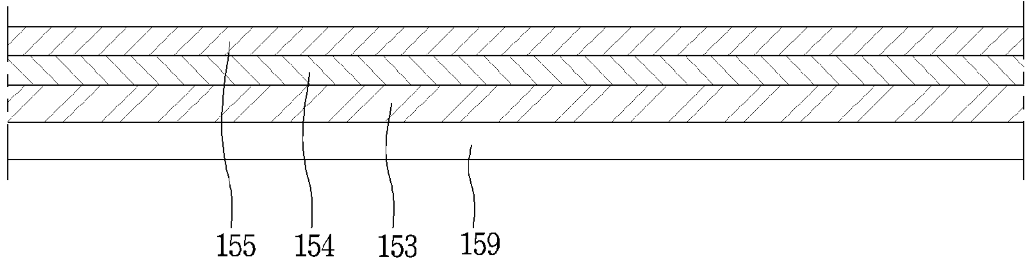
FIGS. 5A to 5E are conceptual views for explaining a new process of manufacturing the foregoing semiconductor light-emitting device.

First, according to a manufacturing method, a first conductive semiconductor layer 153, an active layer 154, and a second conductive semiconductor layer 155 are respectively grown on a growth substrate 159 (FIG. 5A).

When the first conductive semiconductor layer 153 is grown, next, the active layer 154 is grown on the first conductive semiconductor layer 153, and then the second conductive semiconductor layer 155 is grown on the active layer 154. As described above, when the first conductive semiconductor layer 153, the active layer 154 and the second conductive semiconductor layer 155 are sequentially grown, the first conductive semiconductor layer 153, the active layer 154, and the second conductive semiconductor layer 155 form a layer structure as illustrated in FIG. 5A.

In this case, the first conductive semiconductor layer 153 may be a p-type semiconductor layer, and the second conductive semiconductor layer 155 may be an n-type semiconductor layer. However, the present disclosure is not limited thereto, and the first conductive type may be n-type and the second conductive type may be p-type.

Furthermore, although the present embodiment illustrates a case in which the active layer 154 is present, a structure in which the active layer 154 is not present can be made in some cases as described above. For such an example, the p-type semiconductor layer may be p-type GaN doped with Mg on a p-electrode side, and the n-type semiconductor layer may be n-type GaN doped with Si on an n-electrode side.

The growth substrate 159 (wafer) may be formed of any one of light-transmitting materials, for example, sapphire ($Al_2O_3$), GaN, ZnO, and AlO, but is not limited thereto. In addition, the growth substrate 159 may be formed of a material suitable for semiconductor material growth (carrier wafer) or a material having excellent thermal conductivity. The growth substrate 159 includes a conductive substrate or an insulating substrate, and for example, a SiC substrate having higher thermal conductivity than a sapphire ($Al_2O_3$) substrate or at least one of Si, GaAs, GaP, InP, and $Ga_2O_3$ may be used.

Figure 5B:
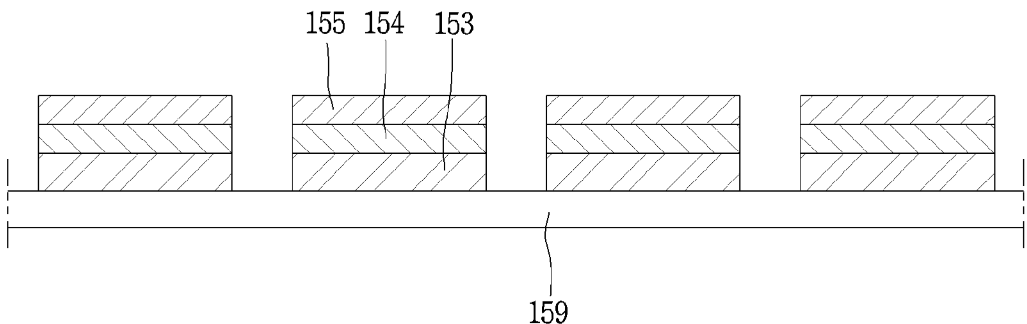

Next, at least part of the first conductive semiconductor layer 153, the active layer 154, and the second conductive semiconductor layer 155 is removed to form a plurality of semiconductor light-emitting devices (FIG. 5B).

More specifically, isolation is performed so that a plurality of semiconductor light-emitting devices form a light-emitting device array. In other words, the first conductive semiconductor layer 153, the active layer 154, and the second conductive semiconductor layer 155 are etched in a vertical direction to form a plurality of semiconductor light-emitting devices.

If it is a case of forming the horizontal semiconductor light-emitting device, then the active layer 154 and the second conductive semiconductor layer 155 may be partially removed in a vertical direction to perform a mesa process in which the first conductive semiconductor layer 153 is exposed to the outside, and then isolation in which the first conductive semiconductor layer is etched to form a plurality of semiconductor light-emitting device arrays.

Figure 5C:
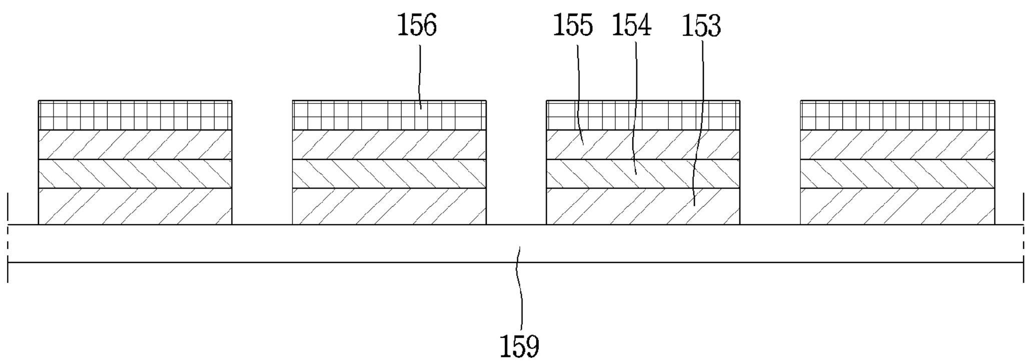

Next, a second conductive electrode 156 (or a p-type electrode) is respectively formed on one surface of the second conductive semiconductor layer 155 (FIG. 5C). The second conductive electrode 156 may be formed by a deposition process such as sputtering, but is not necessarily limited thereto. However, when the first conductive semiconductor layer and the second conductive semiconductor layer are an n-type semiconductor layer and a p-type semiconductor layer, respectively, the second conductive electrode 156 may also be an n-type electrode.

Figure 5D:
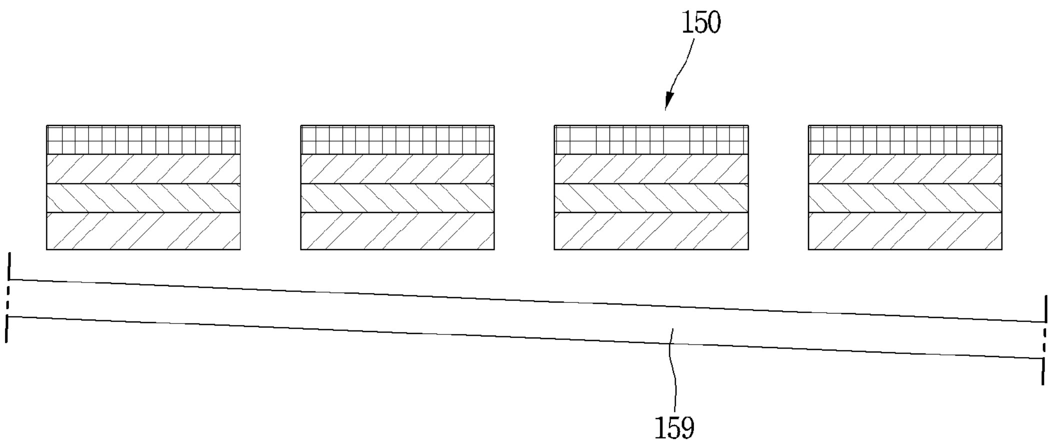

Then, the growth substrate 159 is removed to provide a plurality of semiconductor light-emitting devices. For example, the growth substrate 159 may be removed using a laser lift-off (LLO) or chemical lift-off (CLO) method (FIG. 5D).

Figure 5E:
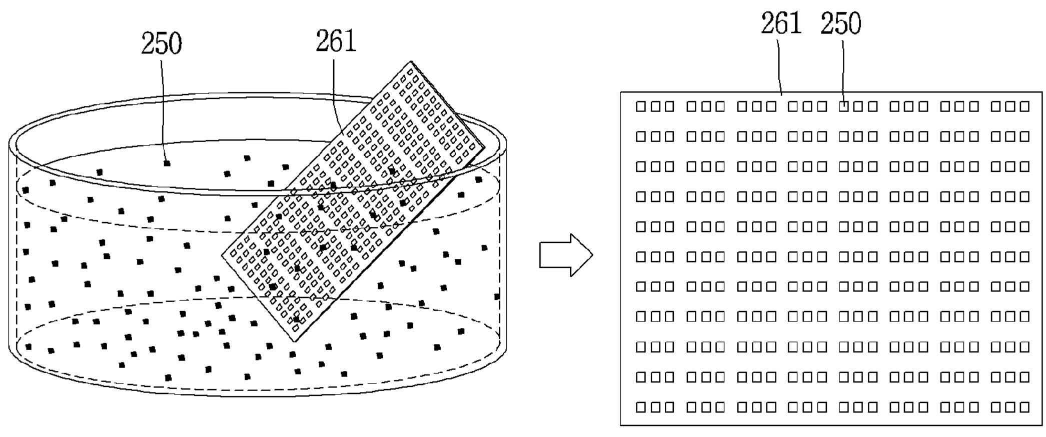

Then, placing the semiconductor light-emitting devices 150 on the substrate in a chamber filled with a fluid is carried out (FIG. 5E).

For example, the semiconductor light-emitting devices 150 and the substrate are placed in a chamber filled with a fluid, and the semiconductor light-emitting devices 150 are assembled to the substrate by themselves using flow, gravity, surface tension, or the like. In this case, the substrate may be an assembly substrate 161.

For another example, the wiring substrate may also be placed into the fluid chamber instead of the assembly substrate 161 such that the semiconductor light-emitting devices 150 are directly placed on the wiring substrate. However, for convenience of description, in the present disclosure, it is illustrated that the substrate is provided as an assembly substrate 161 and the semiconductor light-emitting devices 150 are placed thereon.

Cells (not shown) into which the semiconductor light-emitting devices 150 are fitted may be provided on the assembly substrate 161 so that the semiconductor light-emitting devices 150 are easily placed on the assembly substrate 161. Specifically, cells on which the semiconductor light-emitting devices 150 are placed are formed on the assembly substrate 161 at positions where the semiconductor light-emitting devices 150 are aligned with the wiring electrodes. The semiconductor light-emitting devices 150 are assembled into the cells while moving in the fluid.

After the plurality of semiconductor light-emitting devices 150 are placed on the assembly substrate 161, when the semiconductor light-emitting devices 150 of the assembly substrate 161 are transferred to a wiring substrate, large-area transfer can be made. Therefore, the assembly substrate 161 may be referred to as a temporary substrate.

Meanwhile, in order to apply the self-assembly method described above to the manufacture of a large-screen display, it is necessary to increase the transfer yield. The present disclosure proposes a method and device for minimizing the influence of gravity or friction and preventing non-specific binding in order to increase the transfer yield.

In this case, in a display device according to the present disclosure, a magnetic body is disposed on the semiconductor light-emitting device to move the semiconductor light-emitting device using a magnetic force, and place the semiconductor light-emitting device at a preset position using an electric field in the movement process. Hereinafter, such a transfer method and device will be described in more detail with reference to the accompanying drawings.

Figure 6:
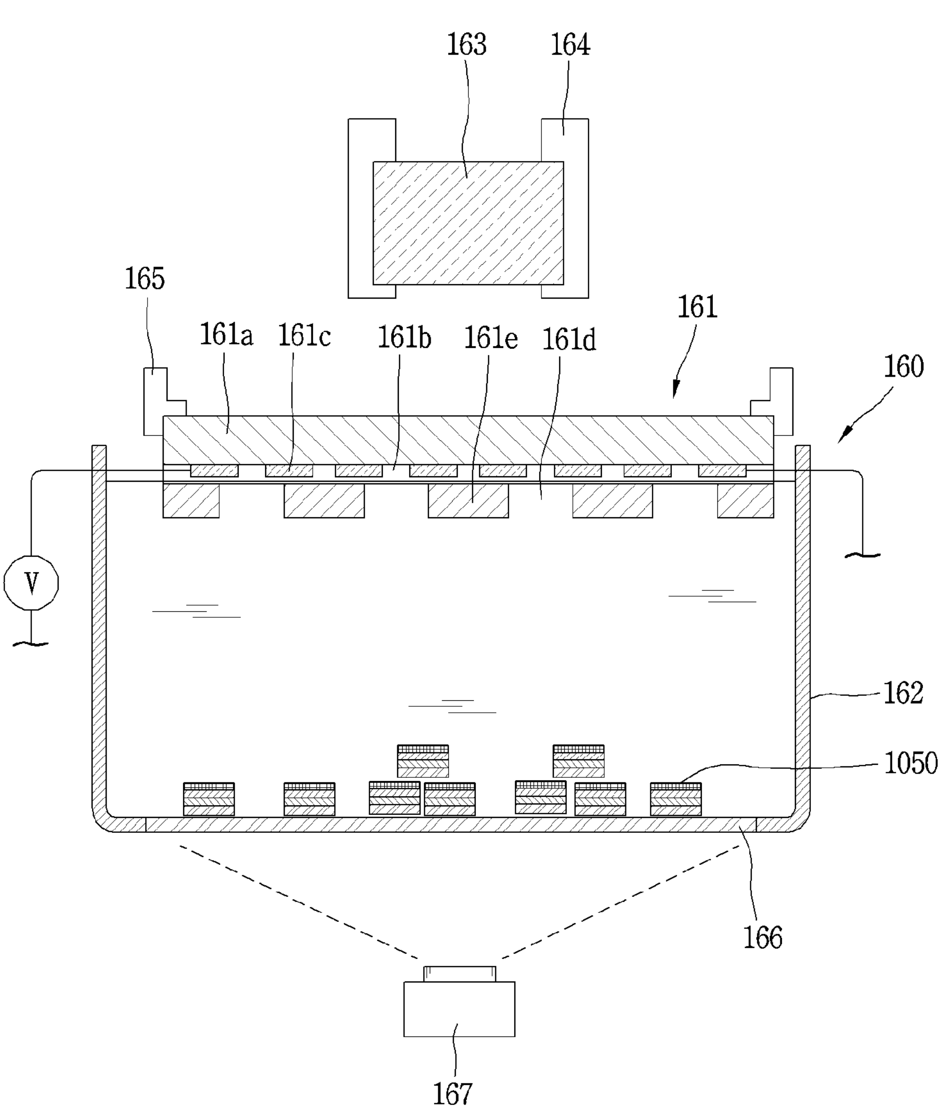
FIG. 6 is a conceptual view showing an example of a self-assembly device of semiconductor light-emitting devices according to the present disclosure.
Figure 7:
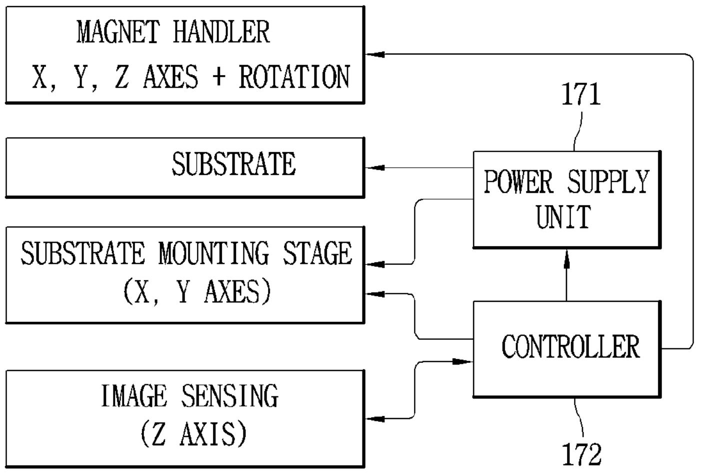
FIG. 7 is a block diagram showing the self-assembly device in FIG. 6.

FIG. 6 is a conceptual view showing an example of a self-assembly device of semiconductor light-emitting devices according to the present disclosure, and FIG. 7 is a block diagram showing the self-assembly device in FIG. 6. FIGS. 8A to 8E are conceptual views showing a process of self-assembling semiconductor light-emitting devices using the self-assembly device in FIG. 6, and FIG. 9 is a conceptual view for explaining the semiconductor light-emitting device in FIGS. 8A to 8E.

According to the illustration of FIGS. 6 and 7, a self-assembly device 160 of the present disclosure may include a fluid chamber 162, a magnet 163, and a location controller 164.

The fluid chamber 162 has a space for accommodating a plurality of semiconductor light-emitting devices. The space may be filled with a fluid, and the fluid may include water or the like as an assembly solution. Accordingly, the fluid chamber 162 may be a water tank, and may be configured with an open type. However, the present disclosure is not limited thereto, and the fluid chamber 162 may be a closed type in which the space is formed with a closed space.

The fluid chamber 162 may be disposed such that an assembly surface of the substrate 161 on which the semiconductor light-emitting devices 150 are assembled faces downward. For example, the substrate 161 may be transferred to an assembly position by a transfer unit, and the transfer unit may include a stage 165 on which the substrate is mounted. The position of the stage 165 may be controlled by a controller, and through this, the substrate 161 may be transferred to the assembly position.

At this time, the assembly surface of the substrate 161 faces the bottom of the fluid chamber 162 at the assembly position. According to the illustration, the assembly surface of the substrate 161 is disposed so as to be immersed in a fluid in the fluid chamber 162. Therefore, the semiconductor light-emitting devices 150 are moved to the assembly surface in the fluid.

The substrate 161, which is an assembly substrate on which an electric field can be formed, may include a base portion 161*a*, a dielectric layer 161*b* and a plurality of electrodes 161*c*.

The base portion 161*a* may be made of an insulating material, and the plurality of electrodes 161*c* may be a thin or a thick film bi-planar electrode patterned on one side of the base portion 161*a*. The electrode 161*c* may be formed of, for example, a stack of Ti/Cu/Ti, an Ag paste, ITO, and the like.

The dielectric layer 161*b* may be made of an inorganic material such as $SiO_2$, SiNx, SiON, $Al_2O_3$, $TiO_2$, $HfO_2$. Alternatively, the dielectric layer 161*b* may be composed of a single layer or multiple layers as an organic insulator. A thickness of the dielectric layer 161*b* may be several tens of nanometers to several micrometers.

Furthermore, the substrate 161 according to the present disclosure includes a plurality of cells 161*d* partitioned by partition walls. The cells 161*d* may be sequentially arranged along one direction, and made of a polymer material. In addition, the partition wall 161*e* constituting the cells 161*d* is configured to be shared with neighboring cells 161*d*. The partition walls 161*e* are protruded from the base portion 161*a*, and the cells 161*d* may be sequentially arranged along the one direction by the partition walls 161*e*. More specifically, the cells 161*d* are sequentially arranged in row and column directions, and may have a matrix structure.

An inside of the cells 161*d* has a groove for accommodating the semiconductor light-emitting device 150, and the groove may be a space defined by the partition walls 161*e*. The shape of the groove may be the same as or similar to that of the semiconductor light-emitting device. For example, when the semiconductor light-emitting device is in a rectangular shape, the groove may be a rectangular shape. In addition, when the semiconductor light-emitting device is circular, the grooves formed in the cells may be formed in a circular shape. Moreover, each of the cells 161*d* is configured to accommodate a single semiconductor light-emitting device. In other words, a single semiconductor light-emitting device is accommodated in a single cell.

Meanwhile, the plurality of electrodes 161*c* include a plurality of electrode lines disposed at the bottom of each of the cells 161*d*, and the plurality of electrode lines may be configured to extend to neighboring cells.

The plurality of electrodes 161*c* are disposed below the cells 161*d* and applied with different polarities to generate an electric field in the cells 161*d*. In order to form the electric field, the dielectric layer 161*b* may form the bottom of the cells 161*d* while the dielectric layer 161*b* covers the plurality of electrodes 161*c*. In such a structure, when different polarities are applied to a pair of electrodes 161*c* from a lower side of each cell 161*d*, an electric field may be formed, and the semiconductor light-emitting device may be inserted into the cells 161*d* by the electric field.

At the assembly position, the electrodes of the substrate 161 are electrically connected to the power supply unit 171. The power supply unit 171 applies power to the plurality of electrodes 161*c* to generate the electric field.

According to the illustration, the self-assembly device may include a magnet 163 for applying a magnetic force to the semiconductor light-emitting devices 150. The magnet 163 is spaced apart from the fluid chamber 162 to apply a magnetic force to the semiconductor light-emitting devices 150. The magnet 163 may be disposed to face an opposite side of the assembly surface of the substrate 161, and the location of the magnet 163 is controlled by the location controller 164 connected to the magnet 163.

The semiconductor light-emitting device may have a magnetic body so as to move in the fluid by the magnetic field of the magnet 163.

Referring to FIG. 9, the semiconductor light-emitting device 1050 having a magnetic body may include a first conductive electrode 1052 and a second conductive electrode 1056, a first conductive semiconductor layer 1053 disposed with the first conductive electrode 1052, a second conductive semiconductor layer 1055 configured to overlap the first conductive semiconductor layer 1053, and disposed with the second conductive electrode 1056, and an active layer 1054 disposed between the first and second conductive semiconductor layers 1053, 1055.

Here, the first conductive type and the second conductive type may be p-type and n-type, respectively, and vice versa. Furthermore, as described above, it may be a semiconductor light-emitting device without having the active layer.

Meanwhile, in the present disclosure, the first conductive electrode 1052 may be generated after the semiconductor light-emitting device 1050 is assembled on a wiring board by self-assembly or the like. In addition, in the present disclosure, the second conductive electrode 1056 may include a magnetic body. The magnetic body may refer to a metal having magnetism. The magnetic body may be Ni, SmCo or the like, and for another example, a material corresponding to at least one of Gd-based, La-based, and Mn-based materials.

The magnetic body may be provided in the second conductive electrode 1056 in the form of particles. Furthermore, alternatively, for a conductive electrode including a magnetic body, a single layer of the conductive electrode may be made of a magnetic body. For such an example, as illustrated in FIG. 9, the second conductive electrode 1056 of the semiconductor light-emitting device 1050 may include a first layer 1056*a* and a second layer 1056*b*, wherein the first layer 1056*a* may include a magnetic body, and the second layer 1056*b* may include a metal material rather than a magnetic body.

In this example, the first layer 1056*a* including a magnetic body may be disposed to be in contact with the second conductive semiconductor layer 1055. In this case, the first layer 1056*a* may be disposed between the second layer 1056*b* and the second conductive semiconductor layer 1055, and the second layer 1056*b* may be a contact metal connected to a wiring of the wiring substrate. However, the present disclosure is not necessarily limited thereto, and the magnetic body may be disposed on one surface of the first conductive semiconductor layer 1053.

Referring again to FIGS. 6 and 7, the self-assembly device may include a magnet handler that can be automatically or manually moved in the x, y, and z axes on the top of the fluid chamber 162 or include a motor capable of rotating the magnet 163. The magnet handler and the motor may constitute the location controller 164. Through this, the magnet 163 rotates in a horizontal direction, a clockwise direction, or a counterclockwise direction with respect to the substrate 161.

On the other hand, a light-transmitting bottom plate 166 may be formed in the fluid chamber 162, and the semiconductor light-emitting devices may be disposed between the bottom plate 166 and the substrate 161. An image sensor 167 may be positioned to view the bottom plate 166 so as to monitor an inside of the fluid chamber 162 through the bottom plate 166. The image sensor 167 is controlled by the controller 172, and may include an inverted type lens, a CCD, and the like to observe the assembly surface of the substrate 161.

The self-assembly device described above is configured to use a combination of a magnetic field and an electric field, and using those fields, the semiconductor light-emitting devices may be placed at preset positions of the substrate by an electric field in the process of being moved by a location change of the magnet. Hereinafter, an assembly process using the self-assembly device described above will be described in more detail.

First, a plurality of semiconductor light-emitting devices 1050 having magnetic bodies are formed through the process described with reference to FIGS. 5A to 5C. In this case, a magnetic body may be deposited in the process of forming the second conductive electrode in FIG. 5C.

Figure 8A:
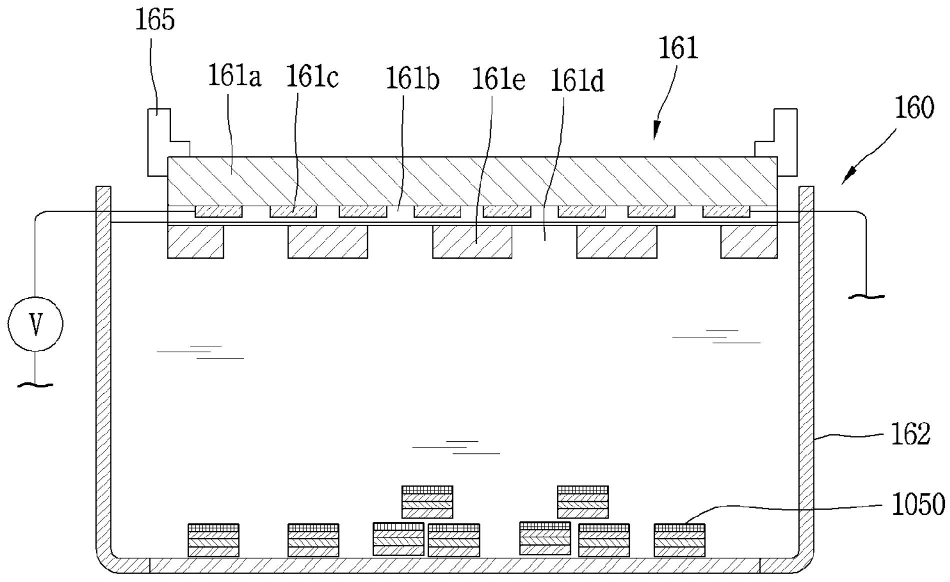
FIGS. 8A to 8E are conceptual views showing a step of self-assembling semiconductor light-emitting devices using the self-assembly device in FIG. 6.
Figure 9:
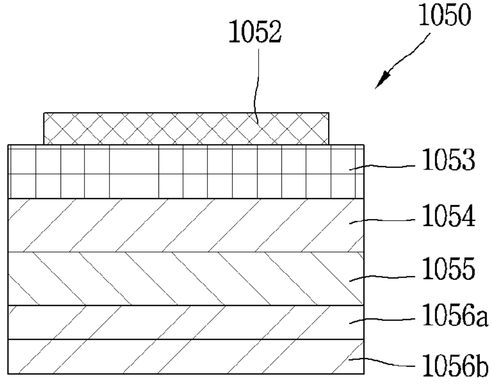
FIG. 9 is a conceptual view for explaining the semiconductor light-emitting device in FIGS. 8A to 8E.

Next, the substrate 161 is transferred to the assembly position, and the semiconductor light-emitting devices 1050 are placed into the fluid chamber 162 (FIG. 8A).

As described above, the assembly position of the substrate 161 is a position at which the assembly surface on which the semiconductor light-emitting devices 1050 of the substrate 161 are assembled is disposed in a downward direction in the fluid chamber 162.

In this case, some of the semiconductor light-emitting devices 1050 may sink to the bottom of the fluid chamber 162 and some may float in the fluid. When the light-transmitting bottom plate 166 is provided in the fluid chamber 162, some of the semiconductor light-emitting devices 1050 may sink to the bottom plate 166.

Figure 8B:
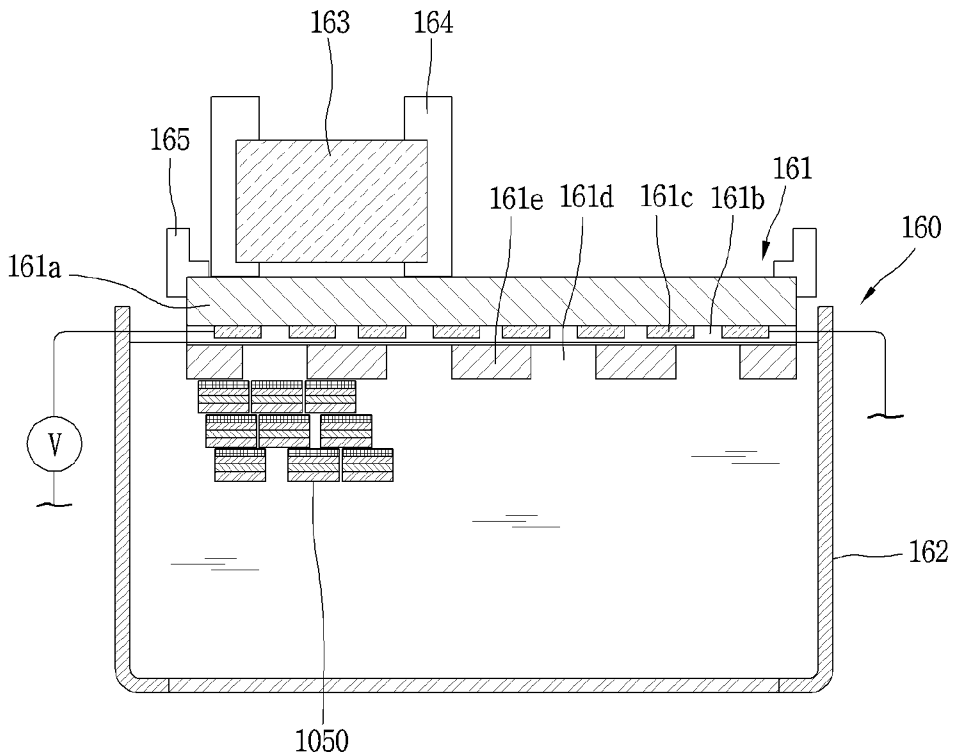

Next, a magnetic force is applied to the semiconductor light-emitting devices 1050 so that the semiconductor light-emitting devices 1050 float in the fluid chamber 162 in a vertical direction (FIG. 8B).

When the magnet 163 of the self-assembly device moves from its original position to an opposite side of the assembly surface of the substrate 161, the semiconductor light-emitting devices 1050 float in the fluid toward the substrate 161. The original position may be a position away from the fluid chamber 162. For another example, the magnet 163 may be configured as an electromagnet, and in this case, electricity is supplied to the electromagnet to generate an initial magnetic force.

Meanwhile, in this example, a separation distance between the assembly surface of the substrate 161 and the semiconductor light-emitting devices 1050 may be controlled by adjusting the magnitude of the magnetic force. For example, the separation distance may be controlled using the weight, buoyancy, and magnetic force of the semiconductor light-emitting devices 1050. The separation distance may be several mm to several tens of μm from the outermost surface of the substrate.

Figure 8C:
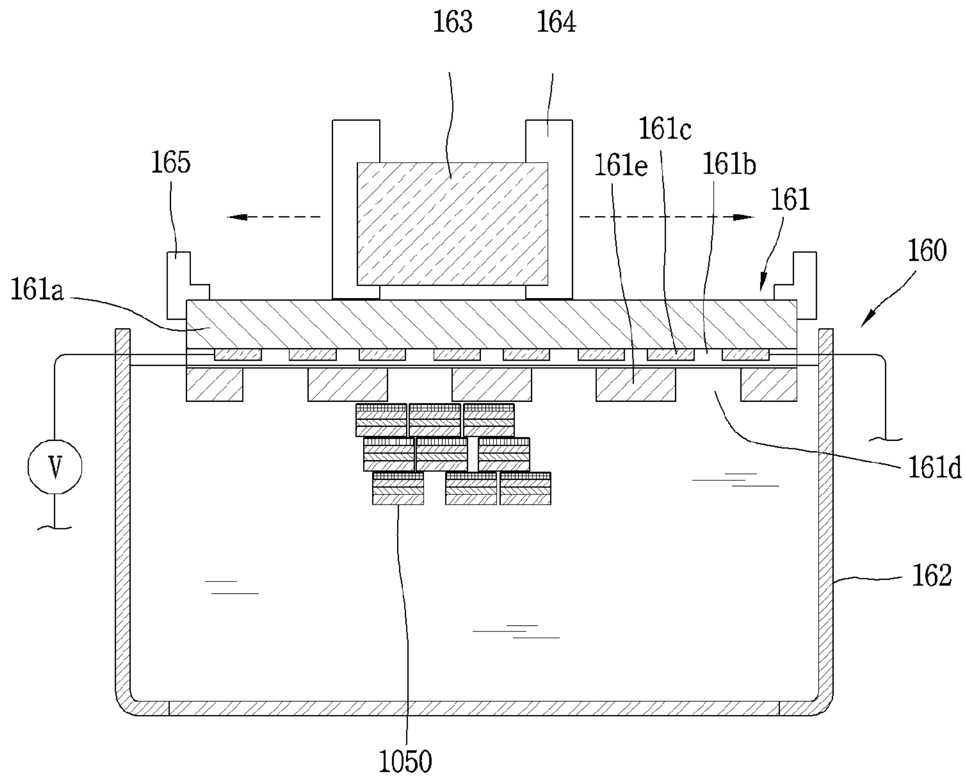

Next, a magnetic force is applied to the semiconductor light-emitting devices 1050 so that the semiconductor light-emitting devices 1050 move in one direction in the fluid chamber 162. For example, the magnet 163 is moved in a horizontal direction, a clockwise direction or a counter-clockwise direction with respect to the substrate 161 (FIG. 8C). In this case, the semiconductor light-emitting devices 1050 move in a direction parallel to the substrate 161 at a position spaced apart from the substrate 161 by the magnetic force.

Next, applying an electric field to guide the semiconductor light-emitting devices 1050 to preset positions of the substrate 161 so as to allow the semiconductor light-emitting devices 1050 to be placed at the preset positions during the movement of the semiconductor light-emitting devices 250 is carried out (FIG. 8C).

For example, the semiconductor light-emitting devices 1050 move in a direction perpendicular to the substrate 161 by the electric field to be placed at preset positions of the substrate 161 while moving along a direction parallel to the substrate 161.

More specifically, electric power is supplied to a bi-planar electrode of the substrate 161 to generate an electric field to guide assembly only at preset positions using the electric field. In other words, the semiconductor light-emitting devices 1050 are assembled to the assembly position of the substrate 161 using a selectively generated electric field. For this purpose, the substrate 161 may include cells in which the semiconductor light-emitting devices 1050 are inserted.

Then, the unloading process of the substrate 161 is carried out, and the assembly process is completed. When the substrate 161 is an assembly substrate, a post-process of transferring the arrayed semiconductor light-emitting devices to a wiring substrate as described above to implement a display device may be carried out.

Figure 8D:
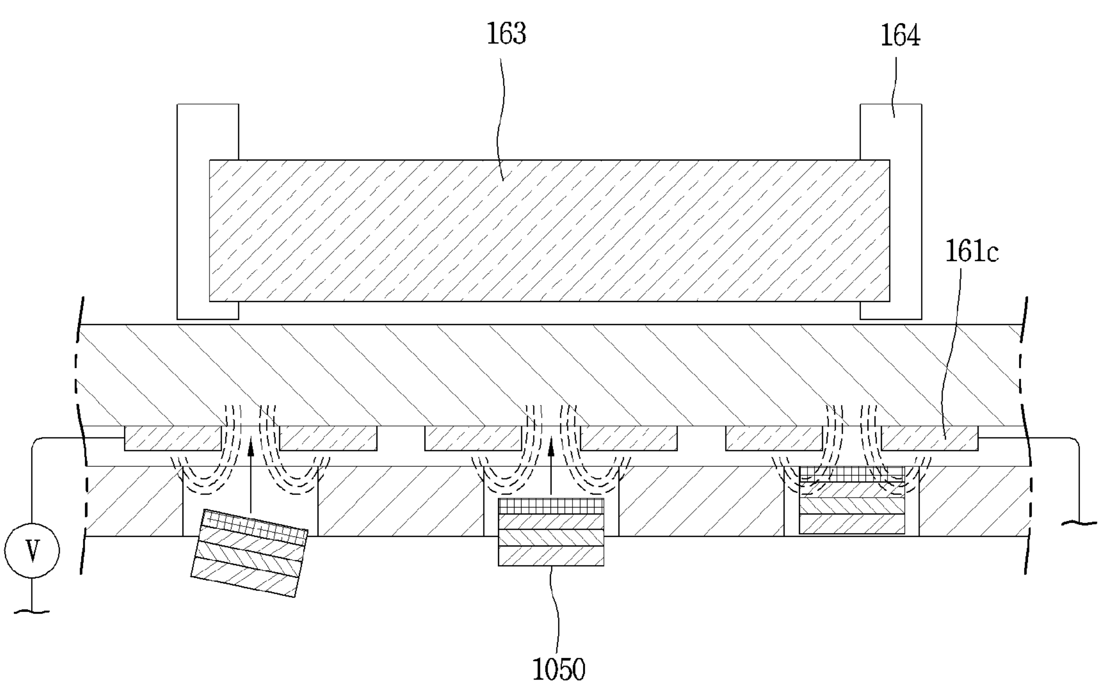
Figure 8E:
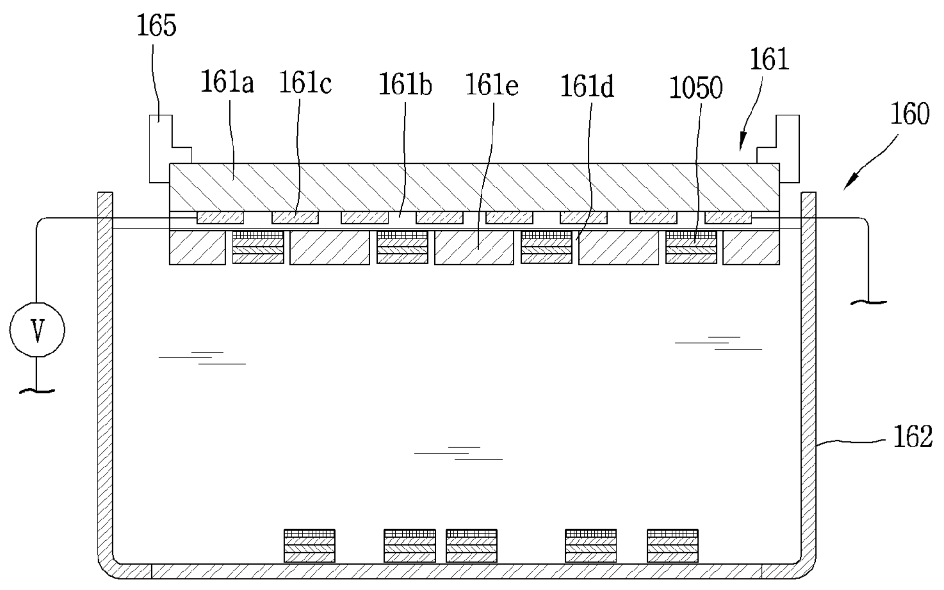

On the other hand, the semiconductor light-emitting devices 1050 may be guided to the preset positions, then the magnet 163 may move in a direction away from the substrate 161 such that the semiconductor light-emitting devices 1050 remaining in the fluid chambers 162 fall to the bottom of the fluid chambers 162, (FIG. 8D). For another example, if power supply is stopped when the magnet 163 is an electromagnet, then the semiconductor light-emitting devices 1050 remaining in the fluid chamber 162 may fall to the bottom of the fluid chamber 162.

Then, when the semiconductor light-emitting devices 1050 on the bottom of the fluid chamber 162 are collected, the collected semiconductor light-emitting devices 1050 may be reused.

The above-described self-assembly device and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. That is, in order to increase the transfer yield, the assembly substrate is placed on the upper portion to minimize the influence of gravity or frictional force and prevent non-specific binding.

As described above, according to the present disclosure having the foregoing configuration, a large number of semiconductor light-emitting devices may be assembled at one time in a display device in which individual pixels are formed with semiconductor light-emitting devices.

As described above, according to the present disclosure, a large number of semiconductor light-emitting devices may be pixelated on a wafer having a small size, and then transferred onto a large-area substrate. Through this, it may be possible to fabricate a large-area display device at a low cost.

The present disclosure relates to a display device having a structure capable of transferring semiconductor light-emitting devices at a high speed through the above-described self-assembly.

In particular, in the present disclosure, a substrate to which the semiconductor light-emitting devices are transferred through self-assembly may be a substrate on which a wiring is formed. Hereinafter, a display device driven by a passive matrix (PM) method will be described, but may also be driven by an active matrix (AM) method.

Figure 10:
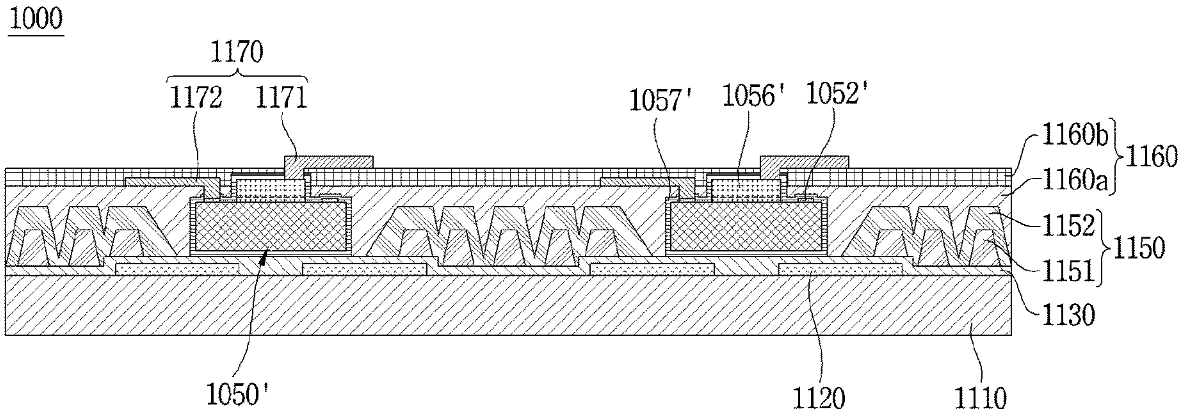
FIGS. 10 and 11 are cross-sectional views of a display device according to a first embodiment of the present disclosure.
Figure 11:
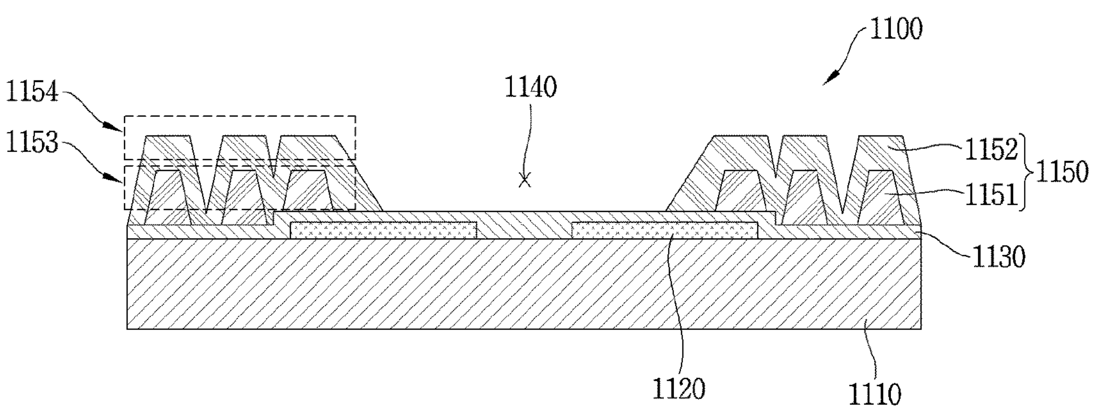
Figure 12:
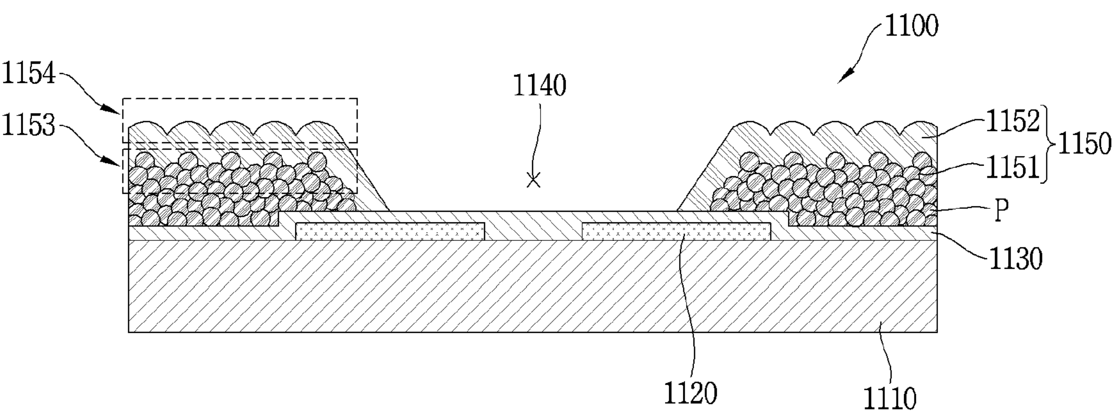
FIG. 12 is a cross-sectional view of a display device according to a second embodiment of the present disclosure.

FIGS. 10 and 11 are cross-sectional views of a display device according to a first embodiment of the present disclosure, and FIG. 12 is a cross-sectional view of a display device according to a second embodiment of the present disclosure.

A display device 1000 according to the present disclosure includes semiconductor light-emitting devices 1050' and a substrate 1100 in which the semiconductor light-emitting devices 1050' are accommodated. The substrate 1100 includes a wiring electrode 1170 electrically connected to the semiconductor light-emitting devices 1050'.

The substrate 1100 includes a base portion 1110, assembly electrodes 1120, a dielectric layer 1130, a partition wall portion 1150, and a planarization layer 1160.

The base portion 1110 may be a base layer on which a structure is formed through an entire process. The base portion 1110 may include sapphire, glass, silicon, or the like, or may include polyimide (PI) to implement flexibility. In addition, any insulating and flexible material such as polyethylene naphthalate (PEN) or polyethylene terephthalate (PET) may be used. Furthermore, the base portion 1110 may be made of a transparent material or a non-transparent material.

The assembly electrodes 1120 may be line-shaped electrodes extending in one direction. The assembly electrodes 1120 may be configured with a plurality of lines and disposed on the base portion 1110 at predetermined intervals.

A voltage signal for forming an electric field in the substrate 1100 is applied to the assembly electrodes 1120. Accordingly, the assembled electrodes 1120 may be formed of a resistive metal such as Al, Mo, Cu, Ag, Ti, or the like or an alloy selected from these metals.

The assembly electrodes 1120 may be patterned at predetermined intervals on the base portion 1110 by depositing the metal material through sputtering on the base portion 1110, forming a PR pattern, and then etching an area in which the PR pattern is not formed. An interval between the assembled electrodes 1120 may be several to several tens of The remaining PR pattern is removed through an ashing process, and typically $O_2$ gas may be used in the ashing process.

The dielectric layer 1130 may be formed to cover the assembly electrodes 1120. The dielectric layer 1130 constitutes a bottom surface of the cell 1140 on which the semiconductor light-emitting device 1050' is placed, and electrically insulates the semiconductor light-emitting device 1050' from the assembly electrodes 1120. The dielectric layer 1130 may be made of an inorganic material, such as $SiO_2$, SiNx, $Al_2O_3$, $TiO_2$, $HfO_2$, which has excellent insulating properties and low light absorption.

The partition wall portion 1150 may be formed on the dielectric layer 1130 while forming the cell 1140 on which the semiconductor light-emitting devices 1050' are placed. The cells 1140 may be formed along an extension direction of the assembly electrodes 1120 and may be disposed in a matrix arrangement as a whole. Furthermore, the cell 1140 may overlap two adjacent assembly electrodes 1120 at the same time. Therefore, when a voltage signal is applied to the assembly electrodes 1120, an electric field may be strongly formed inside the cell 1140.

According to the present disclosure, the partition wall portion 1150 may be formed of a multi-layer structure of the first partition wall portion 1151 and the second partition wall portion 1152. Specifically, the first partition wall portion 1151 may be formed on the dielectric layer 1130, and the second partition wall portion 1152 may be formed to cover the first partition wall portion 1151. The second partition wall portion 1152 may be formed to completely cover upper and side surfaces of the first partition wall portion 1151 based on a deposition direction of the substrate 1100. Accordingly, the second partition wall portion 1152 may form an inner surface of the cell 1140.

According to the present disclosure, the first partition wall portion 1151 and the second partition wall portion 1152 may include fine patterns 1153, 1154. The fine pattern 1154 of the second partition wall portion 1152 is to reduce a frictional force acting between a surface of the substrate 1110 and the semiconductor light-emitting device 1050' during self-assembly, and the fine pattern 1153 may serve as a basis for forming the fine pattern 1154 on the second partition wall portion 1152. That is, the fine pattern 1154 of the second partition wall portion 1152 may be formed along the fine pattern 1153 of the first partition wall portion 1151.

The first partition wall portion 1151 may be formed of a metal material, and may be formed to have a thickness of several nm. The fine pattern 1153 of the first partition wall portion 1151 may be formed in various shapes. In an embodiment, the first partition wall portion 1151 may form the fine pattern 1153 by depositing a metal material in the form of a thin film as shown in FIG. 11. In another embodiment, the first partition wall portion 1151 may form the fine pattern 1153 by depositing metal particles p in an island shape as shown in FIG. 12. In this case, the metal particles p may be nanoparticles having a particle diameter of a nano size. As such, the fine pattern 1153 of the first partition wall portion 1151 may have a different pattern according to a deposition type of the metal material.

In addition, since the first partition wall portion 1151 is formed of a metal material, an electric field leaking from the assembly electrodes 1120 to a region other than the cell 1140, for example, an upper portion of the partition wall portion 1150, may be shielded. Accordingly, it may be possible to prevent the semiconductor light-emitting devices 1050' from being incorrectly assembled in areas other than the cell 1140 during self-assembly.

The second partition wall portion 1152 may be formed to cover the first partition wall portion 1151 along the fine pattern 1153 of the first partition wall portion 1151. Accordingly, the fine pattern 1153 of the first partition wall portion 1151 and the fine pattern 1154 of the second partition wall portion 1152 may be formed in a similar shape to each other.

Meanwhile, the second partition wall portion 1152 may be formed of an insulating material. For example, the second partition wall portion 1152 may be formed of a polymer material such as PAC or PI or an inorganic material such as $SiO_2$ or SiNx. In addition, the second partition wall portion 1152 may be formed at a thickness of several μm.

For example, the partition wall portion 1150 may be formed through the following process.

In the case of the partition wall portion 1150 including the fine patterns 1153, 1154 as shown in FIGS. 10 and 11, a step of depositing a metal material in the form of a thin film on the dielectric layer 1130, and then forming the first partition wall portion 1151 including the fine pattern 1153 through a photolithography process, and depositing an organic or inorganic insulating material on the first partition wall portion 1151 and then forming the second partition wall portion 1152 including the fine pattern 1154 through a photolithography process may be performed. In this case, a PR pattern may include a pattern corresponding to the fine patterns 1153, 1154 and a pattern for forming the cell 1140.

On the other hand, in the case of the partition wall portion 1150 including the fine patterns 1153, 1154 as shown in FIG. 12, metal particles p may be deposited on the dielectric layer 1130 in the form of an island to form the first partition wall portion, and an organic or inorganic insulating material may be deposited on the first partition wall portion 1151 to form the second partition wall portion 1152, and then a photolithography process may be performed. In this case, the PR pattern may include a pattern for forming the cell 1140. That is, when the first partition wall portion 1151 is formed using the metal particles p, the photolithography process is performed only once, so there is an advantage in terms of process simplification.

The partition wall portion 1150 is not limited to the above-described embodiment, and may be formed through various methods. In addition, the thickness, fine pattern, and the like of the partition wall portion 1150 shown in the drawing are shown for explanation and do not correspond to an actual structure.

Meanwhile, the substrate 1100 is transferred to an assembly position for self-assembly in a state in which the assembly electrodes 1120, the dielectric layer 1130, and the partition wall portion 1150 are formed on the base portion 1110, and through self-assembly, the semiconductor light-emitting devices 1050' may be placed into the cell 1140 formed by the partition wall portion 1150.

Therefore, when the fine pattern 1154 is formed on a surface of the second partition wall portion 1152, a frictional force between the semiconductor light-emitting device 1050' and the substrate 1100 is reduced, and there is an advantage in that the absorption of the semiconductor light-emitting devices 1050' on a surface of the substrate 1100 is improved and the semiconductor light-emitting devices 1050' can be transferred at a high speed.

The planarization layer 1160 may be formed on the second partition wall portion 1152 while filling into the cell 1140. That is, the planarization layer 1160 may be formed on the substrate 1100 after the semiconductor light-emitting device 1050' is placed on the cell 1140 through self-assembly. Furthermore, the planarization layer 1160 may be formed of a light-transmitting insulating material.

In summary, the fine patterns 1153, 1154 may be formed at an interface between the first partition wall portion 1151 and the second partition wall portion 1152 and at an interface between the second partition wall portion 1152 and the planarization layer 1160, respectively. Here, each interface refers to upper surfaces of the first and second partition wall portions 1151, 1152 based on a deposition direction of the substrate 1100.

Meanwhile, the wiring electrode 1170 may be formed on the planarization layer 1160. The wiring electrode 1170 may be an electrode electrically connected to the semiconductor light-emitting device 1050' to turn on the semiconductor light-emitting device 1050'. The wiring electrode 1170 may include a second electrode 1171 connected to a second conductive electrode 1056' of the semiconductor light-emitting device 1050' and a first electrode 1172 connected to a first conductive electrode 1052' of the semiconductor light-emitting device 1050'.

According to the present disclosure, the semiconductor light-emitting device 1050' may be a symmetrical horizontal semiconductor light-emitting device 1050'. In other words, the semiconductor light-emitting device 1050' may have a polygonal or preferably spherical shape with a symmetrical structure, and may have a structure in which the first conductive electrode 1052' surrounds the second conductive electrode 1056'.

Meanwhile, in the structure in which the first conductive electrode 1052' surrounds the second conductive electrode 1056' as shown in the drawing, the second conductive electrode 1056' corresponds to a light-emitting surface, and may be formed with a transparent electrode such as ITO. Furthermore, a connection portion of the second electrode 1171 connected to the second conductive electrode 1056' may also be formed of a transparent electrode.

In addition, the semiconductor light-emitting device 1050' may include a magnetic body (not shown) to be guided and moved by a magnetic field during self-assembly, and include a passivation layer 1057' surrounding a surface thereof. A portion of the passivation layer 1057' covering the second conductive electrode 1056' and the first conductive electrode 1052' may be removed during a wiring process. Other descriptions of the structure and materials of the semiconductor light-emitting device 1050' are replaced with the above descriptions.

Hereinafter, another embodiment of a display device according to the present disclosure will be described.

Figure 13:
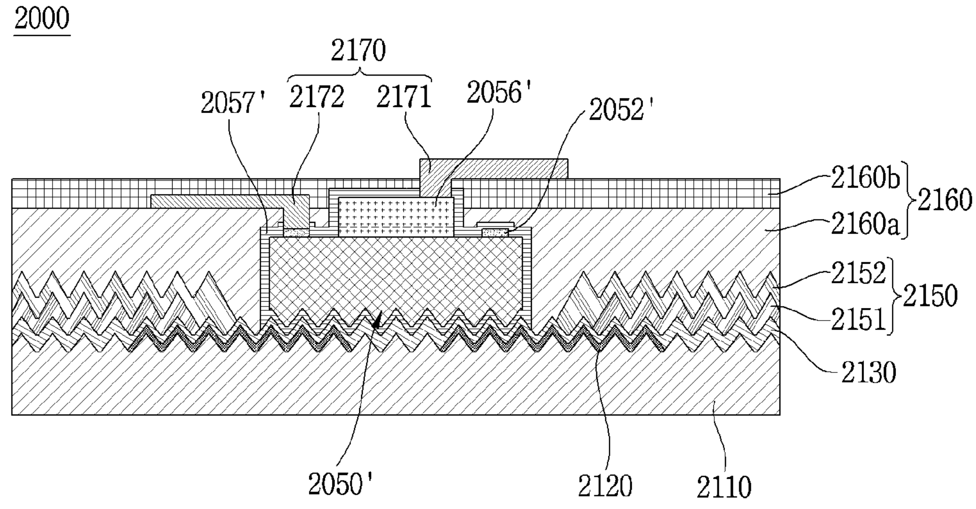
FIGS. 13 and 14 are cross-sectional views of a display device according to a third embodiment of the present disclosure.
Figure 14:
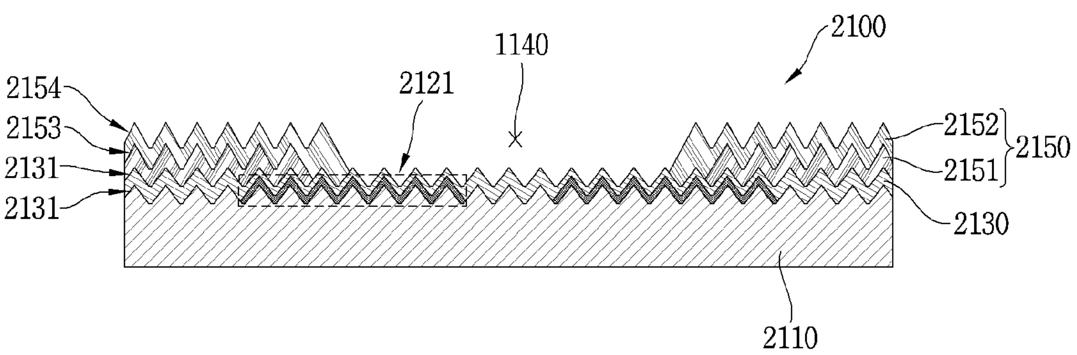

FIGS. 13 and 14 are cross-sectional views of a display device according to a third embodiment of the present disclosure.

Referring to FIGS. 13 and 14, a display device 2000 includes semiconductor light-emitting devices 2050' and a substrate 2100 in which the semiconductor light-emitting devices 2050' are accommodated similar to the above-described example. The substrate 2100 includes a wiring electrode 2170 electrically connected to the semiconductor light-emitting devices 2050'. Furthermore, the substrate 2100 includes a base portion 2110, assembly electrodes 2120, a dielectric layer 2130, a partition wall portion 2150, and a planarization layer 2160.

In this case, the display device 2000 is different from the example shown in FIGS. 10 to 12 described above in that a fine pattern 2111 is formed on the base portion 2110 itself.

As shown, the base portion 2110 may include the fine pattern 2111 on one surface on which the assembly electrodes 2120 are disposed. The fine pattern 2111 of the base portion 2110 may be formed through a process such as texturing, dry etching, chemical etching, or the like. The chemical etching may be performed using a metal.

In this case, the assembly electrodes 2120 may be disposed on the base portion 2110 at predetermined intervals along the fine pattern 2111 of the base portion 2110, and the dielectric layer 2130 may be formed to cover the assembly electrodes 2120 along the fine pattern 2111 of the base portion 2110, and both the assembly electrodes 2120 and the dielectric layer 2130 may include fine patterns 2121, 2131. Moreover, the first partition wall portion 2151 and the second partition wall portion 2152 may also include fine patterns 2153, 2154. Here, the process of forming the assembly electrodes 2120, the dielectric layer 2130, and the partition wall portion 2150 on the base portion 2110 may be the same as the above-described embodiment, and some conditions such as an exposure time, an intensity of a light source, and the like may be appropriately modified and applied thereto.

In this structure, since the fine pattern 2111 is formed on the base portion 2110 itself, there is an advantage capable of simplifying a process of forming the fine pattern 2154 on the second partition wall portion 2152 to reduce a contact area with the semiconductor light-emitting device 1050', which is an end product. That is, when the fine pattern 2111 is formed on the base portion 2110, compositions formed on the base portion 2110 are formed along the fine pattern 2111 of the base portion 2110, and thus there is no need to further pass through a photolithography process for patterning.

Furthermore, the fine pattern 2131 of the dielectric layer 2130 forming a bottom surface of a cell 2140 on which a semiconductor light-emitting device 2050' is placed may reflect light generated from the semiconductor light-emitting device 2050' and emitted toward a rear surface thereof, thereby improving the light-emitting efficiency of the display device 2000.

Moreover, a fine pattern 2058 having a shape corresponding to the fine pattern 2131 of the dielectric layer 2130 may be formed on one surface of the semiconductor light-emitting devices 2050' in contact with the dielectric layer 2030, and in this case, a contact area between the semiconductor light-emitting device 2050' and the dielectric layer 2130 may be maximized. The maximization of the contact area may supplement a fixing force of the semiconductor light-emitting device 2050' to the substrate 2100 in a post process of forming a wiring subsequent to self-assembly.

The configurations and methods according to the above-described embodiments will not be applicable in a limited way to a display device using the foregoing semiconductor light-emitting device, and all or part of each embodiment may be selectively combined and configured to make various modifications thereto.

What is claimed is:

1. A display device comprising:

a substrate;

semiconductor light-emitting devices disposed on the substrate and connected to wiring electrodes;

wherein the substrate comprises:

a base portion;

assembly electrodes disposed on the base portion;

a dielectric layer formed to cover the assembly electrodes; and a plurality of partition wall portions formed on the dielectric layer and defining cells therebetween, wherein the semiconductor light-emitting devices are positioned in the cells, wherein each partition wall portion comprises a first partition wall portion formed on the dielectric layer and a second partition wall portion formed to cover the first partition wall portion, and wherein the second partition wall portion comprises a second pattern, wherein the second partition wall portion is formed to cover a first pattern of the first partition wall portion, wherein the first partition wall portion is formed of a metal material, and the second partition wall portion is formed of an insulating material, wherein the base portion comprises a third pattern on a surface on top of which the assembly electrodes are disposed, and wherein the assembly electrodes are disposed on the base portion along the third pattern of the base portion and have a shape corresponding to the third pattern of the base portion.

2. The display device of claim 1, wherein the first pattern of the first partition wall portion is formed at an interface between the first partition wall portion and the second partition wall portion.

3. The display device of claim 1, further comprising:

a planarization layer formed on the second partition wall portion and disposed in the cell.

4. The display device of claim 3, wherein the second pattern of the second partition wall portion is formed at an interface between the second partition wall portion and the planarization layer.

5. The display device of claim 1, wherein the partition wall portions are formed to overlap the assembly electrodes.

6. The display device of claim 1, wherein opposing surfaces of adjacent second partition wall portions form inner surfaces of the cell.

7. The display device of claim 1, wherein the dielectric layer is formed to cover the assembly electrodes to overlap the third pattern of the base portion.

8. The display device of claim 7, wherein the semiconductor light-emitting devices each comprise a fourth pattern on a surface in contact with the dielectric layer, wherein the fourth pattern of the semiconductor light-emitting device has a shape corresponding to a fifth pattern of the dielectric layer.

* * * * *